US006624700B2

United States Patent
Luo et al.

(10) Patent No.: US 6,624,700 B2
(45) Date of Patent: Sep. 23, 2003

(54) RADIO FREQUENCY POWER AMPLIFIER FOR CELLULAR TELEPHONES

(75) Inventors: Sifen Luo, Hartsdale, NY (US); Tirdad Sowlati, Ossining, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 31 days.

(21) Appl. No.: 09/893,710

(22) Filed: Jun. 29, 2001

(65) Prior Publication Data

US 2003/0011434 A1 Jan. 16, 2003

(51) Int. Cl.$^7$ .................................................. H03G 3/10
(52) U.S. Cl. ........................ 330/281; 330/267; 330/285
(58) Field of Search ............................. 330/281, 285, 330/289, 266, 282, 267

(56) References Cited

U.S. PATENT DOCUMENTS

| | | | |
|---|---|---|---|
| 4,107,621 A | 8/1978 | Furutani et al. | 330/296 |
| 4,924,194 A | * 5/1990 | Opas et al. | 330/266 |
| 5,986,509 A | 11/1999 | Lohninger | 330/290 |
| 6,052,032 A | * 4/2000 | Jarvinen | 330/289 |
| 6,111,466 A | 8/2000 | Mokhtar et al. | 330/296 |
| 6,239,659 B1 | * 5/2001 | Grassle | |

FOREIGN PATENT DOCUMENTS

| | | | |
|---|---|---|---|
| EP | 0734118 A1 | 9/1996 | H03F/1/02 |
| WO | WO0122573 | 3/2001 | H03F/1/30 |

OTHER PUBLICATIONS

Baranov et al: "Investigation Of The Temperature Stability Of A Broadband Microwaveamplifier–Limiter," Telecommunications And Radio Engineering, Begell House, Inc., New York, NY, vol. 43, NR. 7, 1989, pp. 148–150.

* cited by examiner

Primary Examiner—Tuan T. Lam
Assistant Examiner—Hiep Nguyen
(74) Attorney, Agent, or Firm—Aaron Waxler

(57) ABSTRACT

A bias circuit having a relatively long time constant improves the linearity of a radio frequency power amplifier of a spread spectrum mobile telephone by causing a power transistor of the amplifier to operate in class A or AB mode. The power amplifier thus derives an output signal that is a substantial replica of the spread spectrum input signal for all amplitudes of the input signal. The bias circuit has transistors connected in a feedback circuit which tends to oscillate to affect the amplifier operation. A low pass filter connected to the transistors suppresses the tendency. An interstage high pass matching circuit between a linear amplifier that drives the power amplifier includes a series capacitor and an inductor connected between an output terminal of the linear amplifier and a DC power supply terminal.

7 Claims, 6 Drawing Sheets

RADIO FREQUENCY POWER AMPLIFIER FOR CELLULAR TELEPHONES

FIELD OF THE INVENTION

The present invention relates generally to radio frequency (RF) power amplifiers for spread spectrum digital cellular telephones, and more particularly to such an amplifier having an output stage biased for class AB operation to achieve a linear replica of a spread spectrum input signal of the amplifier. Another aspect of the invention relates to a bias circuit for such an amplifier, wherein circuitry suppresses a tendency of the bias circuit to oscillate in a manner to affect operation of the amplifier.

BACKGROUND OF THE INVENTION

Mobile telecommunication systems using spread spectrum techniques, such as code division multiple access (CDMA) and third generation (3G), can accommodate a large number of users per given bandwidth. In one particular type of CDMA system, known as direct sequence CDMA (DS-CDMA), a base station applies to data signals a pseudo-random noise binary sequence selected for a particular cellular phone, i.e., mobile station. The cellular phone responds to the sequence to derive a sequence synchronized with the base station sequence to establish a communication link between the cellular phone and base station. Power of the link is varied as a function of the power requirements to achieve satisfactory communications between the base station and cellular phone. For example, when the phone is far from the base station, the link power is greater than when the phone and base station are close to each other.

FIG. 1 is a block diagram of some elements of a prior art CDMA cellular telephone 10. Data source 11, e.g., a voice source or tone sources responsive to keyboard activation, drives signal processor 12 for processing the signal of source 11 into a phase modulated, spread spectrum signal that drives power amplifier 16 which in turn drives conventional transmitter 17, including a switch or diplexer, coupled to antenna 18.

Processor 12 includes a data modulator, carrier generator, spread spectrum modulator, and a pseudo-random binary sequence generator, all configured in a known manner. The data modulator of processor 12 responds to signals from a CDMA base station in proximity to telephone 10 to vary the amplitude of the spread spectrum signal the processor supplies to power amplifier 16 as a function of the power needed to provide adequate transmission between telephone 10 and the CDMA base station. For example, if there is a strong transmission link between telephone 10 and the base station because they are close to each other, the amplitude of the signal driving amplifier 16 is substantially less than the amplitude of the signal driving the amplifier if there is a weak transmission link because the base station and telephone are far apart. Battery 20 supplies power to all components in CDMA phone 10, including power amplifier 16.

A parameter associated with radio frequency power amplifiers is "power added efficiency," defined as the amplifier output radio frequency power ($P_{RFO}$) minus the amplifier input radio frequency ($P_{RFI}$) divided by the DC power supplied to the amplifier ($P_{DC}$), i.e., $$\frac{P_{RFO} - P_{RFI}}{P_{DC}}.$$

To achieve the desired power added efficiency, the output stage of the prior art power amplifier of FIG. 1 is biased to operate in class AB mode; i.e., a power amplifying transistor of the power amplifier of FIG. 1 is biased to be on more than 180 degrees and less than 360 degrees of each cycle of the amplifier input signal. As a result of the prior art amplifier being off during a portion of each cycle of the amplifier input, the amplifier linearity decreases, i.e., the amplifier output signal is not a faithful linear replica of the amplifier input signal. The amplifier is usually designed so there is a compromise between power added efficiency and linearity, with the optimum combination being achieved by setting the highest power added efficiency possible for a given linearity requirement. In CDMA cellular telephones, the limit for the power added efficiency is set according to the linearity requirement for the adjacent channel power ratio, i.e., the ratio of power in a channel which is one channel away from the main signal channel (the distortion product) to the power in the main signal channel. Meeting the linearity requirement requires proper control of the quiescent current in the power amplifier.

Our co-pending application Ser. No. 09/621,525, filed Jul. 21, 2000, herein incorporated by reference, discloses a cellular telephone power amplifier with control of power transistor quiescent current using an impedance-controllable biasing circuit. This amplifier achieves high power added efficiency while maintaining substantial linearity by biasing a control electrode of the transistor and controlling quiescent current flowing through the power amplifying transistor to maintain the power transistor in class AB operation.

We found the power amplifier linearity was improved by adding a low pass filter to circuitry for biasing the control electrode. The low pass filter, comprising a shunt capacitor and series resistor, reduces the alternate-channel-power ratio, i.e., the ratio of power in a channel which is two channels removed from the main signal channel to the power in the main signal channel. The reduced alternate-channel-power ratio resulted in improved linearity. This improvement in linearity reduced power amplifier harmonics and noise and leads to greater power added efficiency.

Our co-pending application Ser. No. 09/730,657, filed Dec. 6, 2000, herein incorporated by reference, discloses a cellular telephone power amplifier with a power transistor biasing circuit including a low pass filter having a shunt capacitor that acts as a self bias booster. The low pass filter, in the preferred embodiment, includes a 15 ohm series resistor and a 2.2 picofarad capacitor, resulting in the filter having a 33 picosecond ($33 \times 10^{-12}$ s.) time constant. With this bias arrangement, the power amplifying transistor is biased to operate in class AB mode.

While such circuitry was effective in improving power amplifier linearity, we have found that it is possible to improve linearity even more without materially adversely affecting power added efficiency. It is accordingly an object of the present invention to provide a new and improved cellular telephone linear power amplifier without excessive compromise of power added efficiency.

Experiments with the biasing circuitry of the '525 application reveal that the biasing circuitry has a tendency to oscillate at frequencies or harmonics which affect the operation in a pass band of the cellular telephone power amplifier. Oscillations or harmonics resulting from this tendency interfere with and can possibly mask proper transmission from the cellular phone to the base station.

It is, accordingly, another object of the invention to provide a new and improved cellular telephone with a biasing circuit having a tendency to oscillate so as to interfere with the signal transmitted from the phone, wherein the tendency is suppressed.

SUMMARY OF THE INVENTION

In accordance with one aspect of our invention, a mobile telephone of a spread spectrum wireless telephone system has a radio frequency power amplifier comprising (1) a power transistor including a control electrode for controlling a variable impedance path between first and second electrodes of the transistor, and (2) a bias circuit for supplying a bias voltage to the control electrode such that the transistor operates in class A or AB mode as a function of the spread spectrum signal amplitude at the control electrode. The bias circuit includes a low pass filter having a time constant between about 0.15 microseconds and 1.5 microseconds. Time constants in this range are thus about 10,000 to 100,000 times the time constant of our prior art circuit, disclosed in the '657 application. The substantial increase in time constant apparently maintains the power transistor control electrode bias constant regardless of the level of the r.f. signal applied to the electrode, and enables the power transistor to operate in class A for the low amplitude r.f. signals and in class AB for the high amplitude r.f. signals. Thus, higher power added efficiency is provided for the high amplitude signals. The increase in low pass filter time constant provided by the present invention over the prior art has an overall salutary effect on the power amplifier and cellular phone operation. Preferably, the low pass filter includes a series resistor having a resistance of about 15 ohms to control the current flowing to the control electrode and a shunt capacitor having a capacitance in the range of 0.01 to 0.1 microfarads.

In accordance with another aspect of the invention, a mobile telephone of a spread spectrum wireless telephone system includes a radio frequency power amplifier comprising (1) a power transistor having a control electrode responsive to the spread spectrum signal and controlling a variable impedance path between first and second electrodes of the transistor, and (2) a bias circuit for supplying a bias voltage to the control electrode. The bias circuit includes a low pass filter causing (1) the transistor to operate in class A or AB mode as a function of the amplitude of a spread spectrum signal at the control electrode, and (2) the power amplifier to derive an output signal that is a substantial replica of the spread spectrum signal for all amplitudes of the spread spectrum signal.

In accordance with yet another aspect of the invention, a mobile telephone of a spread spectrum wireless telephone system includes a bandpass radio frequency power amplifier comprising (1) an amplifying transistor including a control electrode responsive to the spread spectrum signal and controlling a variable impedance path between first and second electrodes of the transistor, and (2) a bias circuit for supplying a bias voltage to the control electrode. The bias circuit includes first and second transistors connected together in a feedback circuit, which tends to oscillate to have an effect on the operation of the power transistor. Circuitry, preferably in the form of a low pass filter, coupled to the feed back circuit suppresses the tendency for the oscillations to be coupled to the power transistor.

The features and advantages of the present invention will become apparent upon consideration of the following detailed description of a specific embodiment thereof, especially when taken in conjunction with the accompanying drawings.

DETAILED DESCRIPTION OF THE DRAWING

Figure 1:
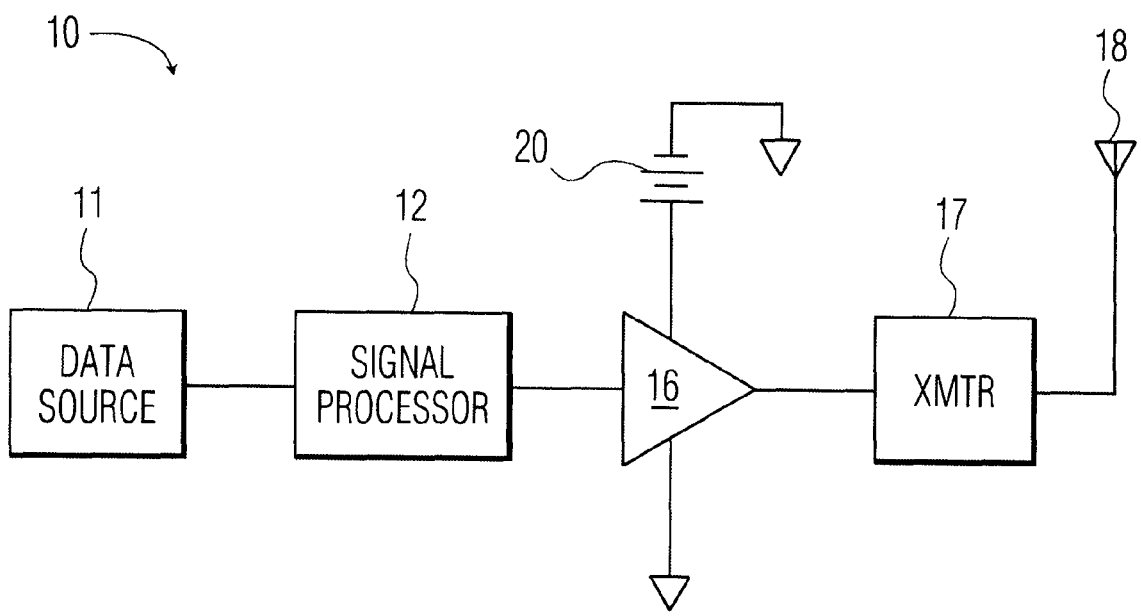
FIG. 1, as described, is a partial block diagram of a prior art CDMA mobile telephone.
Figure 2:
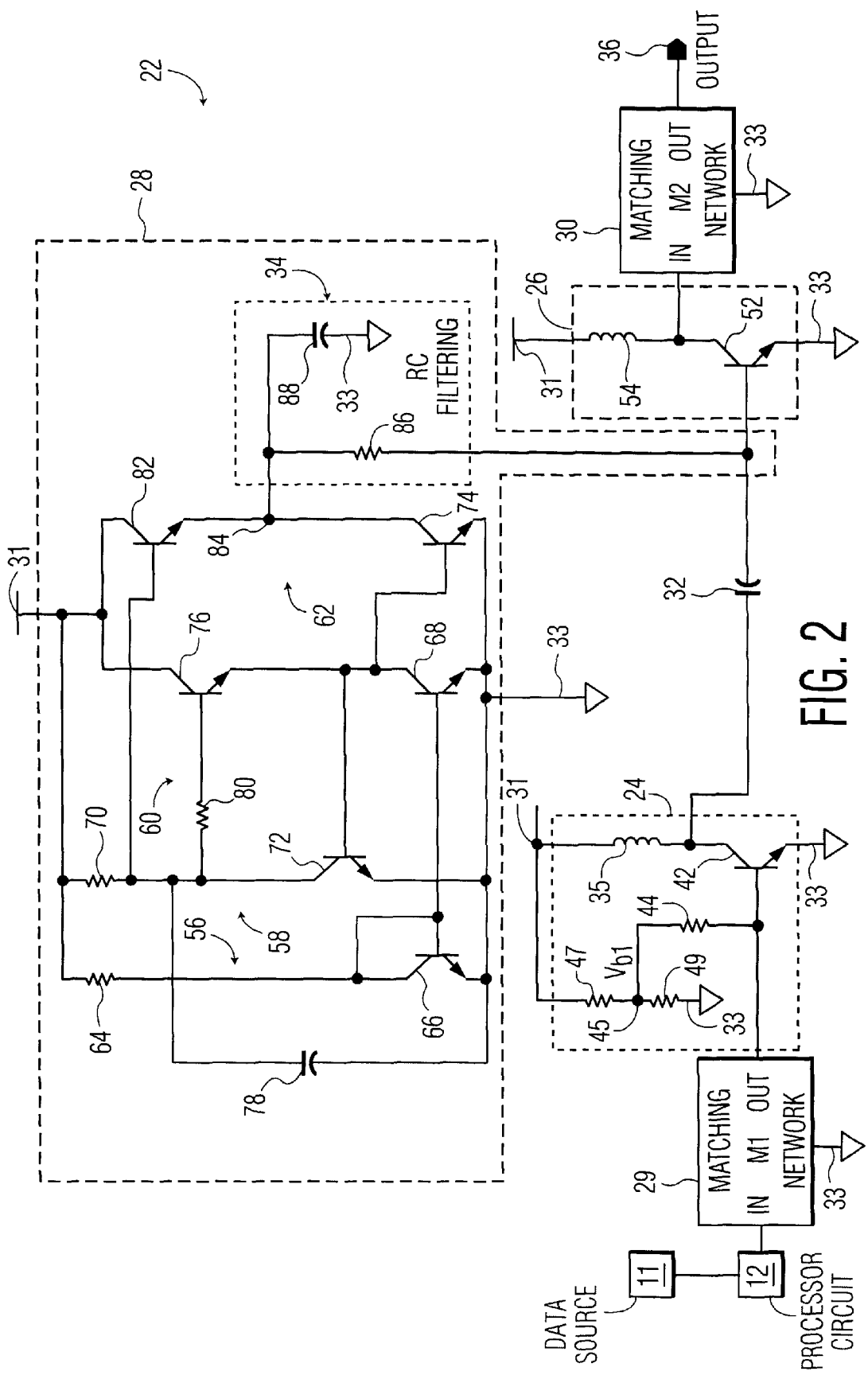
FIG. 2 is a schematic diagram of a preferred embodiment of a radio frequency power amplifier in accordance with the present invention.

Reference is now made to FIG. 2 of the drawings, a schematic diagram of radio frequency amplifier 22 that replaces prior art amplifier 16. Amplifier 22 comprises linear, class A or class AB (as a function of the input signal magnitude), low power, r.f. amplifying stage 24, r.f. power amplifying stage 26, and bias circuit 28, which causes stage 26 to operate in class A or class AB modes, depending on the amplitude of the signal applied to the power amplifier. Amplifier 22 also includes tuned input matching network 29, tuned output matching network 30, and an interstage matching network including series capacitor 32, connected between an output terminal of stage 24 and an input terminal of stage 26. Data source 11 and processor circuit 12, described in connection with FIG. 1, supply a variable amplitude, phase modulated spread spectrum signal to matching network 29. Amplifier 22 also includes positive DC power supply terminal 31 and ground terminal 33, respectively connected to positive and negative electrodes of battery 20 (FIG. 1).

Bias circuit 28 includes a low pass filter 34 having a time constant in the range of about 0.15 microseconds to 1.5 microseconds so stage 26 derives a wave that is a substantially linear replica of the output of input stage 24, regardless of the amplitude of the output of the processing circuit. Stage 26 derives the linear replica because (1) stage 26 operates in class A mode for low amplitude outputs of stage 24 and (2) even though it operates in class AB mode for the high amplitude outputs of stage 24. The large time constant of low pass filter 34, which results from an increase by several orders of magnitude of the filter shunt capacitor, suppresses harmonics which result from class AB operation of stage 26 in response to large amplitude RF input signals to the stage. In addition, the large time constant suppresses noise which bias circuit 28 otherwise has a tendency to introduce into stage 26. Suppression of the harmonics reduces the average DC current flowing through stage 26 as a result of the harmonics. The reduced DC current in stage 26 increases the power added efficiency of the stage. Input and output stages 24 and 26 amplify and invert the signals applied to them and stage 26 drives CDMA phone antenna 18 through matching circuit 30 via transmitter 17.

Matching networks 29 and 30 have a T or Π bandpass filter configuration including only fixed reactances tuned to the center frequency of the bandpass of amplifier 22. The interstage matching network including fixed capacitor 32 also includes fixed inductor 35 in stage 24. Capacitor 32 and inductor 35 are connected in an L-type configuration as a high pass filter. The fixed reactances of matching networks 29 and 30, as well as the interstage matching network and fixed inductor in stage 26, cause amplifier 22 to be a tuned, bandpass amplifier for passing all of the spread spectrum channels that processor 12 derives. These fixed reactances cause bandpass amplifier 22 to have a center frequency in the center of the spread spectrum channel, and steep skirts for rejecting energy outside of the amplifier pass band.

Input stage 24 includes common emitter, npn transistor 42, having a base connected to be responsive to the output signal of impedance matching network 29. The base of transistor 42 is biased by resistor 44 connected to a bias voltage $V_{b1}$, obtained from tap 45 of a resistive voltage divider including resistors 47 and 49, connected between power supply terminals 31 and 33. The emitter of transistor 42 is connected directly to ground and the collector of the transistor is connected via pull-up inductor 35 to power supply terminal 31. The node between inductor 35 and the collector of transistor 42, at the output of stage 24, is connected to one electrode of interstage matching capacitor 32.

Output stage 26 comprises common emitter, npn power transistor 52 having (1) a base connected to respond to the r.f. signal coupled through capacitor 32, (2) a collector connected to drive impedance matching network 30, and (3) a grounded emitter. Bias circuit 28 is connected to supply DC bias to the base of transistor 52 via low pass filter 34. The collector of transistor 52 is connected to positive power supply terminal 31 by pull-up inductor 54, that, in combination with matching circuit 30, forms a high pass filter for the spread spectrum, radio frequency signal that stage 24 applies to stage 26.

Bias circuit 28 applies bias voltage and current to the base (control electrode) of transistor 52 to control the transistor quiescent collector-emitter current, and the transistor 52 emitter-base bias impedance. In particular, bias circuit 28 comprises: (1) network 56 for controlling the quiescent collector-emitter current in transistor 52; (2) network 58 for independently controlling the bias impedance; (3) DC negative feedback circuit 60 to assist in stabilizing the DC bias that circuit 28 supplies to the base of transistor 52; and (4) push-pull circuit 62 to assist in increasing (1) bias circuit efficiency and (2) the stability of the bias current supplied to the base of transistor 52 via low pass filter 34.

Network 56 for controlling the collector-emitter quiescent current of transistor 52 comprises resistor 64 connected in series between power supply terminal 31 and the collector of npn transistor 66. Transistor 66 has a grounded emitter and a base short circuited to the collector of the transistor to cause the transistor to function as a forward biased diode across which a substantially constant voltage is developed. The value of resistor 64 is sufficiently large as to cause the resistor to be a current source. Hence, the current flowing from resistor 64 into its load (primarily the emitter collector path of transistor 66) is substantially constant, despite variations in the impedance of its load, due for example to temperature and/or aging of battery 20.

The common terminal for the collector and base of transistor 66 is connected to the base of npn transistor 68, having a grounded emitter. Resistor 64 and transistors 66, 68 form a current mirror circuit for controlling the quiescent collector emitter current of power transistor 52.

Network 58 for controlling the bias impedance between the base and emitter of transistor 52 includes resistor 70 connected in series between power supply terminal 31 and the collector of npn transistor 72, having a grounded emitter. The value of resistor 70 is also sufficiently large as to cause the resistor to be a constant current source. The base of transistor 72 is directly connected to the collector of transistor 68 and the emitter of npn transistor 76. Transistor 76 has collector and base electrodes respectively connected directly to positive power supply terminal 31 and via series resistor 80 to a node common to resistor 70 and the collector of transistor 72. The common node for the collector of transistor 68 and the emitter of transistor 76, which is also common to the base of transistor 72, is tied to the base of transistor 74, which is part of push-pull circuit 62. Hence, the bases of transistors 72 and 74 are driven by the DC voltage at the collector of transistor 68 and the emitter of transmitter 76 and resistor 70, and transistors 72, 74 form a current mirror circuit. The current mirror including resistor 70 controls the impedance of bias circuit 28 applies between the base and emitter of transistor 52. The terminal common to resistor 70 and the collector of transistor 72 is tied to the base of transistor 82, which is part of push-pull circuit 62. The connections to the bases of transistors 74 and 82 are such that when the voltage at the base of transistor 74 increases, e.g., due to temperature and/or battery aging, the voltage at the base of transistor 82 decreases, and vice versa. Hence, the voltage and current at output terminal 84 of the push pull circuit, between the collector of transistor 74 and the emitter of transistor 82, remain relatively constant, despite such changes.

Transistors 72 and 76 are connected to form feedback circuit 60 for stabilizing the voltage at the base of transistor 74. We found that when the base of transistor 76 was connected directly to the collector of transistor 72, there was a tendency for bias circuit 28 to oscillate and couple oscillations which affect the operation of amplifier 22 to the base of transistor 52. To suppress the oscillations, we added a low pass filter comprising (1) shunt capacitor 78, connected across the emitter and collector of transistor 72, and (2) resistor 80, connected in series between the base of transistor 76 and the collector of transistor 72. Preferably, the value of capacitor 78 is at least 12 pF and the value of resistor 80 is a few ohms. However, under certain circumstances, the low pass filter for suppressing the oscillations and preventing them from being coupled to the base of power transistor 52 can include only capacitor 78, and resistor 80 can be excluded.

Low pass filter 34 comprises (1) resistor 86, connected in series between output node 84 of push-pull circuit 62 and the base of transistor 52, and (2) shunt capacitor 88, connected between node 84 and ground. We found that the linearity of the output of power amplifier 22 improved considerably without sacrificing power added efficiency, when the value of resistance and capacitance for resistor 86 and capacitor 88 are such that the time constant of low pass filter 34 is between about 0.15 microseconds and 1.5 microseconds, preferably with the capacitance having a value in the range of 0.01 to 0.1 microfarads and the resistor having a value of 15 ohms. Considerably higher values of resistor 86 excessively attenuate the bias voltage and/or current and/or adversely affect the impedance of bias circuit 28 across the base and emitter of transistor 52. Because of the large size of capacitor 88, the capacitor was a discrete component mounted off a circuit board carrying the remainder of the circuitry illustrated in FIG. 2.

Figure 3A:
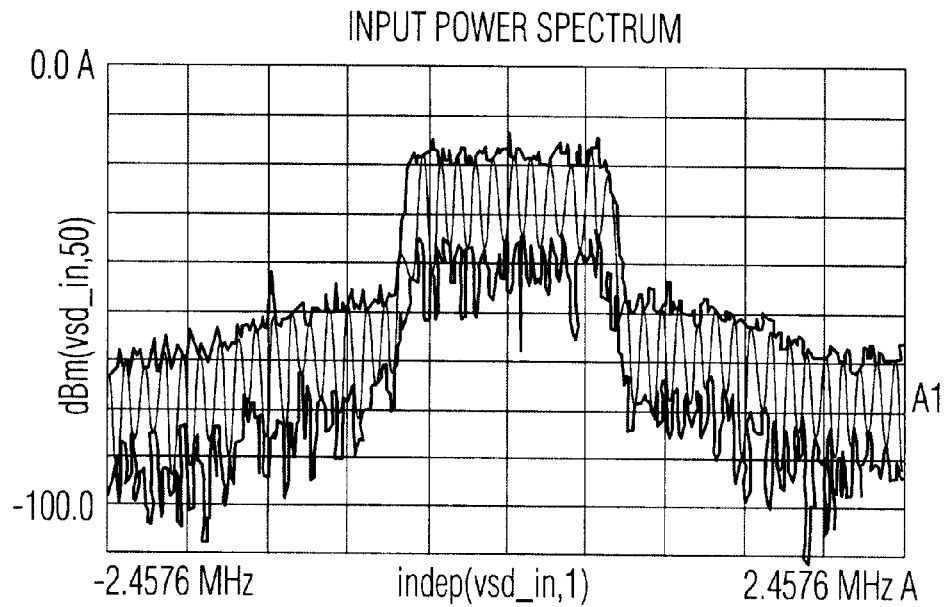
FIGS. 3(a) and 3(b) are computer simulated input and output power spectra, respectively, of a simulated circuit modeled after the power amplifier circuit of FIG. 2 without a capacitor in the bias circuit.
Figure 3B:
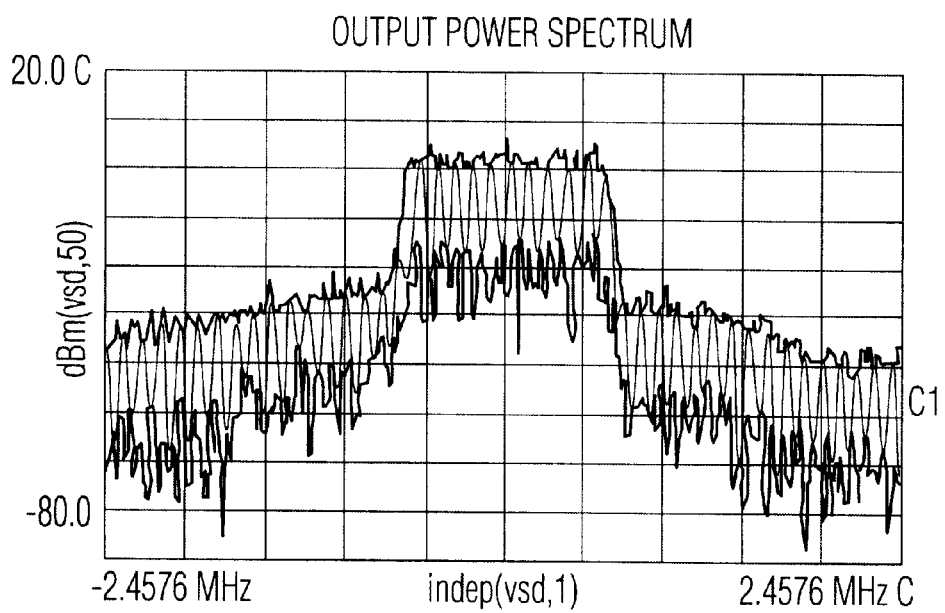
Figure 4A:
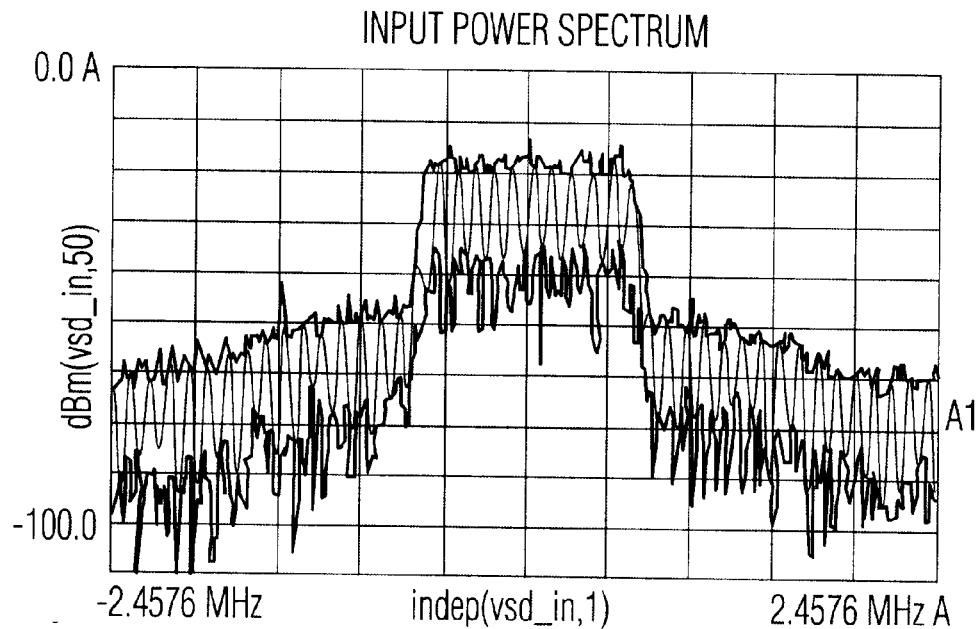
FIGS. 4(a) and 4(b) are computer simulated input and output power spectra, respectively, of a simulated circuit modeled after the power amplifier circuit of FIG. 2 with a long time constant bias circuit.
Figure 4B:
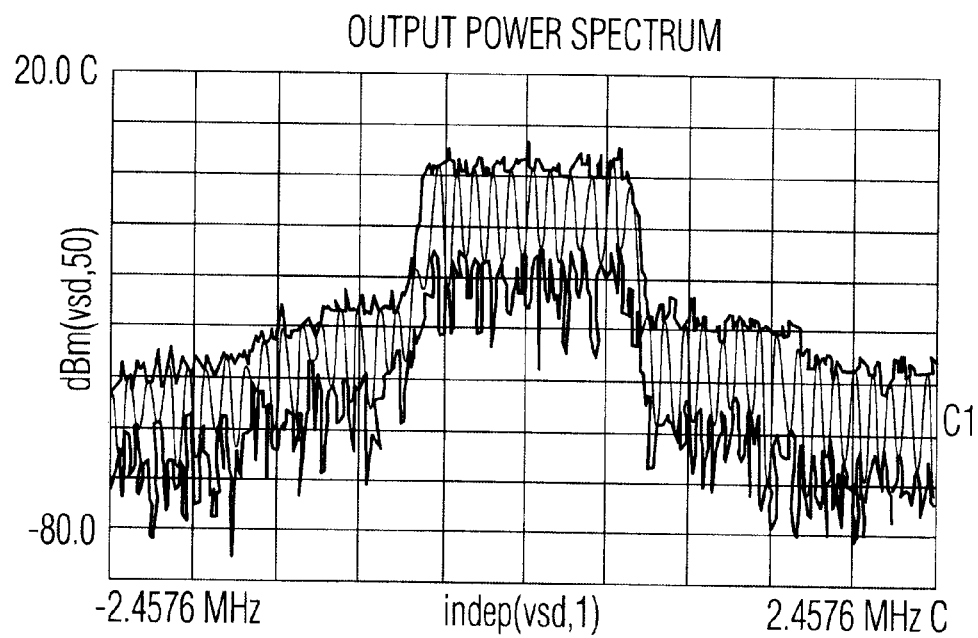

We used an Agilent Technology ADS simulator to verify that the circuit in FIG. 2 would improve the alternatechannel-power ratio of a power amplifier of a CDMA cellular telephone, which in turn would increase the power linearity of the amplifier. FIGS. 3(a) and 3(b) are plots of the input and output power spectra (in dB vs. frequency), respectively, of a simulated circuit having a center frequency of 1.9 GHz and modeled after the power amplifier circuit of FIG. 2 except that it did not include shunt capacitor 88. FIGS. 4(a) and 4(b) are similar plots of the input and output power spectra, respectively, of the same simulated circuit, except that capacitor 88 was included and had a value of 0.1 microfarad. We simulated a 1.9 GHz CDMA input signal to drive the circuit. Without the shunt capacitor 88, the input lower and upper alternate-channel-power ratios were −46.4 dB and −43.4 dB, respectively; and the output lower and upper alternate-channel-power ratios were −55.5 dB and −52.4 dB, respectively. With the 0.1 microfarad shunt capacitor 88, the input lower and upper alternate-channel-power ratios were −46.9 dB and −44.3 dB, respectively; and the output lower and upper alternate-channel-power ratios were −57.1 dB and −55.2 dB, respectively. The improvement in alternate-channel-power ratio is thus at least 1.5 dB while maintaining the same output power.

Figure 5A:
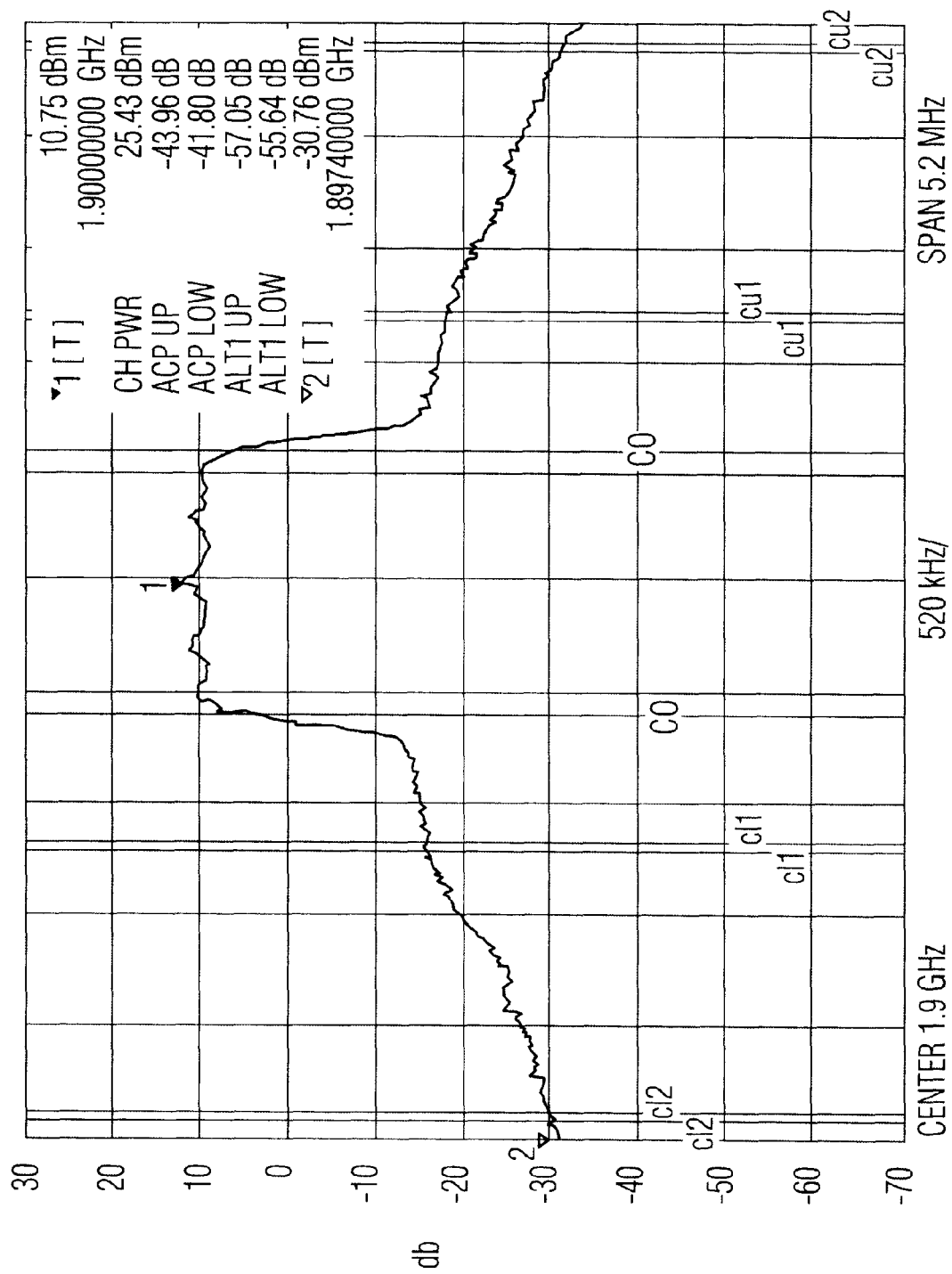
FIG. 5(a) is a plot of amplitude vs. frequency response of the power amplifier of FIG. 2 without a capacitor in the bias circuit.
Figure 5B:
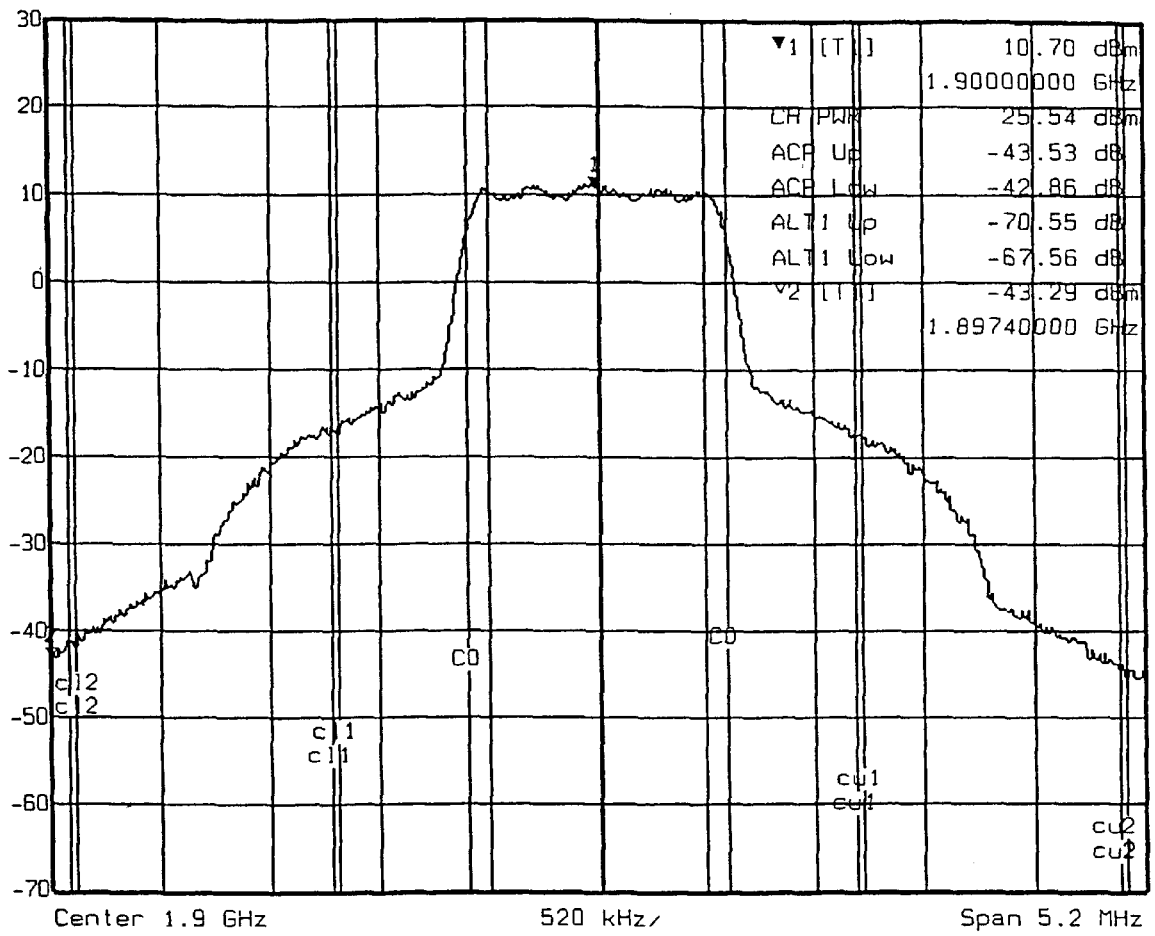
FIG. 5(b) is a plot of amplitude vs. frequency response of the power amplifier of FIG. 2 with a long time constant bias circuit.

We also experimentally tested an amplifier having the configuration of FIG. 2 with a center frequency of 1.9 GHz. The tested amplifier was driven by a 1.9 GHz CDMA input signal. FIG. 5(a) is a plot of the measured output power spectrum of the circuit obtained without shunt capacitor 88. FIG. 5(b) is a plot of the amplitude vs. frequency response of the same circuit driven by the same source, except that capacitor 88 was an off-chip 0.1 microfarad shunt capacitor. For output matching circuit 30, we used a tuner, fine-tuned for each test to optimize matching. From FIGS. 5(a) and 5(b), where "ALT1 Up" and "ALT1 Low" denote the upper and lower alternate-channel-power ratio, respectively, there is an improvement in alternate-channel-power ratio of over 10 dB. Additionally, the adjacent-channel-power ratio improved slightly at approximately the same output power. Also, the total collector current of transistors 42 and 52 decreased from 808 mA to 715 mA, leading to improved power added efficiency. These experimental results thus indicate that low pass filter 34 (FIG. 2) improves the linearity and power added efficiency of amplifier 22.

While there has been described and illustrated one specific embodiment of the invention, it will be clear that variations in the details of the embodiment specifically illustrated and described may be made without departing from the true sprit and scope of the invention as defined in the appended claims. For example, the invention is applicable to other spread spectrum systems, e.g., such systems that might use frequency modulation instead of phase modulation. Hence, the term "angle modulated" covers signals that are phase or frequency modulated. Further, the invention is not limited to bi-polar transistors and is applicable to other types of semiconductors, e.g., field effect devices. In addition, the base bias circuit for transistor 42 can include a current mirror arrangement similar to the current mirror arrangement for biasing the base of transistor 52.

What is claimed is:

1. A radio frequency (RF) power amplifier for a mobile telephone of a spread spectrum wireless telephone system, said mobile telephone being arranged to supply said RF power amplifier with a spread spectrum signal angle modulated by in formation supplied to said mobile telephone, said spread spectrum signal having a variable amplitude dependent on the amount of power necessary to transmit said spread spectrum signal from said mobile telephone to a base station of said spread spectrum wireless system, said RF power amplifier comprising:

a power transistor with a first control electrode (a) connected to be responsive to said spread spectrum signal, and (b) for controlling a variable impedance path between first and second electrodes of said power transistor;

a bias circuit for supplying a bias voltage to said first control electrode, said bias circuit having a low pass filter causing said power transistor to operate in class A or AB mode as a function of said amplitude of said spread spectrum signal at said first control electrode; and a linear input stage for feeding said spread spectrum signal to said first control electrode of said amplifying transistor, said linear input stage having an inductor connected to one of first and second electrodes of an input stage transistor.

2. The power amplifier of claim 1, wherein said input stage transistor has a second control electrode connected to be responsive to said spread spectrum signal for controlling a variable impedance path between first and second electrodes of said input stage transistor.

3. The power amplifier of claim 1, wherein said low pass filter has a time constant between about 0.15 microseconds and 1.5 microseconds.

4. The power amplifier of claim 2, further comprising an interstage matching capacitor connected between said one electrode of said input stage transistor and said first control of said power transistor, said inductor and said interstage matching capacitor being connected to form a filter for passing said spread spectrum signal.

5. The power amplifier of claim 1 further comprising a capacitor connected in series between an output terminal of said linear input stage and said first control electrode.

6. A radio frequency (RF) power amplifier for a mobile telephone of a spread spectrum wireless telephone system, said mobile telephone being arranged to supply said RF power amplifier with a spread spectrum signal angle modulated by information supplied to said mobile telephone, said spread spectrum signal having a variable amplitude dependent on the amount of power necessary to transmit said spread spectrum signal from said mobile telephone to a base station of said spread spectrum wireless system, said RF power amplifier comprising:

a power transistor with a first control electrode (a) connected to be responsive to said spread spectrum signal, and (b) for controlling a variable impedance path between first and second electrodes of said power transistor;

a bias circuit for supplying a bias voltage to said first control electrode, said bias voltage having a value and said power transistor having a characteristic and power supply connections for causing said power transistor to operate in class A or AB mode as a function of said amplitude of said spread spectrum signal at said first control electrode, said bias circuit having a low pass filter, said low pass filter having a time constant between about 0.15 microseconds and 1.5 microseconds; and a linear input stage for feeding said spread spectrum signal to said first control electrode of said amplifying transistor, wherein said linear input stage has an inductor connected to one of said first and second electrodes of said input stage transistor.

7. The power amplifier of claim 1, further comprising an interstage matching capacitor connected between said one electrode of said input stage transistor and said first control electrode of said power transistor, said inductor and said interstage matching capacitor being connected to form a filter for passing said spread spectrum signal.